United States Patent
Lin et al.

(10) Patent No.: US 10,388,825 B2
(45) Date of Patent: Aug. 20, 2019

(54) STRUCTURE WITH MICRO LIGHT-EMITTING DEVICE

(71) Applicant: PixeLED Display co., LTD., Hsinchu County (TW)

(72) Inventors: Tzu-Yang Lin, Hsinchu County (TW); Pei-Hsin Chen, Hsinchu County (TW); Yi-Chun Shih, Hsinchu County (TW); Yi-Ching Chen, Hsinchu County (TW); Yu-Chu Li, Hsinchu County (TW)

(73) Assignee: PixeLED Display co., LTD., Hsinchu County (TW)

( * ) Notice: Subject to any disclaimer, the term of this patent is extended or adjusted under 35 U.S.C. 154(b) by 0 days.

(21) Appl. No.: 15/942,425

(22) Filed: Mar. 30, 2018

(65) Prior Publication Data

US 2019/0115493 A1 Apr. 18, 2019

Related U.S. Application Data

(60) Provisional application No. 62/607,325, filed on Dec. 19, 2017.

(30) Foreign Application Priority Data

Oct. 16, 2017 (TW) .............................. 106135275 A

(51) Int. Cl.
*H01L 21/683* (2006.01)
*H01L 33/00* (2010.01)
*H01L 25/075* (2006.01)

(52) U.S. Cl.
CPC ...... *H01L 33/0079* (2013.01); *H01L 21/6835* (2013.01); *H01L 25/0753* (2013.01); *H01L 2221/68318* (2013.01); *H01L 2221/68363* (2013.01)

(58) Field of Classification Search
CPC ............. H01L 33/0079; H01L 21/6835; H01L 25/0753; H01L 2221/68318; H01L 2221/68363
See application file for complete search history.

(56) References Cited

U.S. PATENT DOCUMENTS

| | | | |
|---|---|---|---|
| 2008/0160293 A1* | 7/2008 | Arimitsu | C09J 5/08 428/332 |
| 2014/0209939 A1* | 7/2014 | Yan | H01L 25/0753 257/88 |
| 2016/0172253 A1* | 6/2016 | Wu | H01L 33/62 438/15 |
| 2016/0268491 A1* | 9/2016 | Wu | H01L 22/20 |

FOREIGN PATENT DOCUMENTS

TW 201130170 9/2011

* cited by examiner

*Primary Examiner* — Sitaramarao S Yechuri
(74) *Attorney, Agent, or Firm* — JCIPRNET

(57) ABSTRACT

A structure with micro light-emitting device includes a substrate, at least one micro light-emitting device, at least one holding structure and a buffer layer. The micro light-emitting device is disposed on the substrate. The holding structure is arranged at an edge of the micro light-emitting device, and is located between the substrate and the micro light-emitting device and directly contacts with the substrate. The buffer layer is disposed between the micro light-emitting device, the holding structures and the substrate.

16 Claims, 13 Drawing Sheets

100A

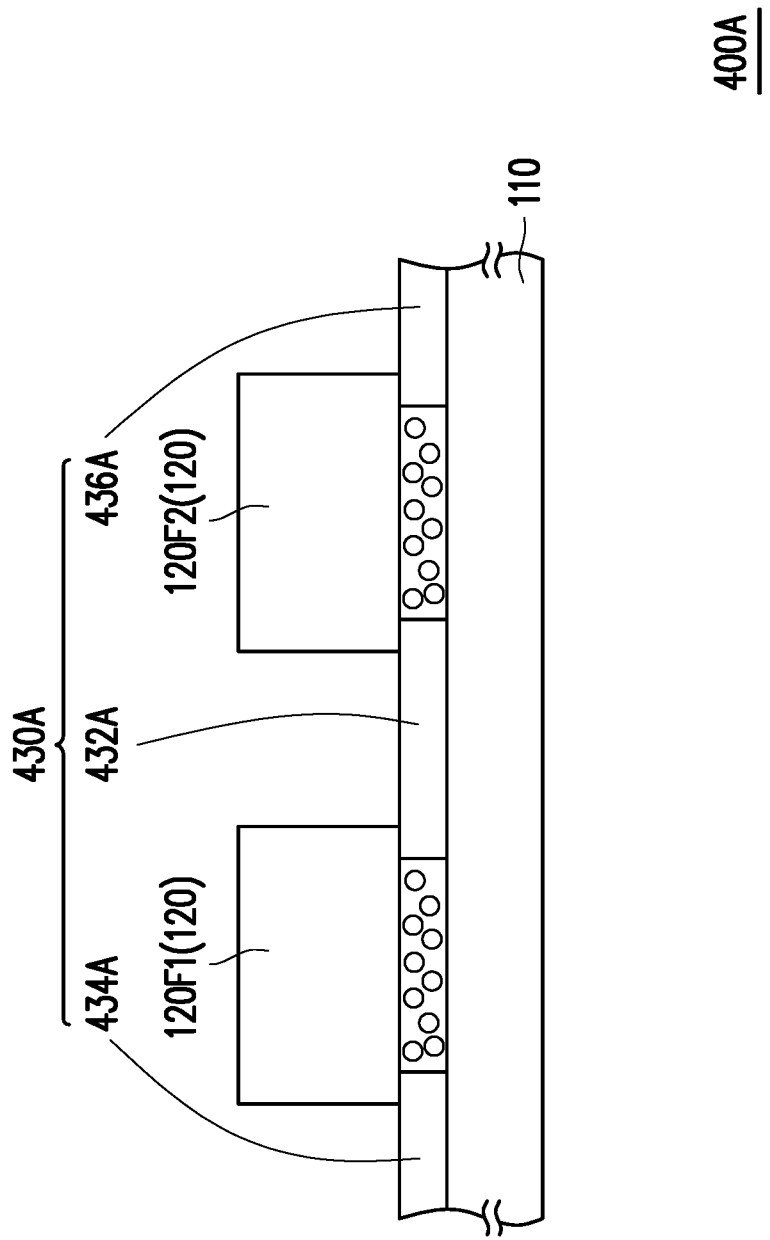

STRUCTURE WITH MICRO LIGHT-EMITTING DEVICE

CROSS-REFERENCE TO RELATED APPLICATION

This application claims the priority benefits of Taiwan application serial no. 106135275, filed on Oct. 16, 2017 and U.S. provisional application Ser. No. 62/607,325, filed on Dec. 19, 2017. The entirety of each of the above-mentioned patent applications is hereby incorporated by reference herein and made a part of this specification.

BACKGROUND OF THE INVENTION

Field of the Invention

The invention relates to a semiconductor structure and more particularly relates to a structure with micro light-emitting device.

Description of Related Art

At present, micro light-emitting device is picked and placed mainly by transferring micro light-emitting device from the carrier substrate to the receiving substrate with the force, such as electrostatic force or magnetic force. Generally speaking, the micro light-emitting device is temporarily hold to the carrier substrate by an adhesive therebetween. However, as the adhesive has a viscosity so strong that the bonding strength between the micro light-emitting device and the adhesive is greater than the force of the micro light-emitting device, it is thereby difficult to pick the micro light-emitting device from the carrier substrate. Therefore, how to temporarily hold the micro light-emitting device on the carrier substrate and how to pick the micro light-emitting device from the carrier substrate more easily and effectively have become important issue in the technical field.

SUMMARY OF THE INVENTION

The invention provides a structure with micro light-emitting device that holds the micro light-emitting device temporarily on the substrate wherein the micro light-emitting device can be picked from the substrate more easily.

A structure with micro light-emitting device of the invention includes a substrate, at least one micro light-emitting device, at least one holding structure and a buffer layer. The micro light-emitting device is disposed on the substrate. The holding structures is dispersedly arranged at an edge of the micro light-emitting device, and is located between the substrate and the micro light-emitting device and directly contacts with the substrate. The buffer layer is disposed between the micro light-emitting device, the holding structure and the substrate.

In an embodiment of the invention, a ratio of a contact area between the micro light-emitting device and the holding structure to an orthogonal projection area of the micro light-emitting device on the substrate falls within a range from 0.05 to 0.15.

In an embodiment of the invention, the at least one holding structure is a plurality of holding structures. The plurality of holding structures are arranged symmetrically with respect to a center of the micro light-emitting device.

In an embodiment of the invention, the plurality of holding structures are aligned respectively with edges of the micro light-emitting device.

In an embodiment of the invention, each of the plurality of holding structures includes a first holding structure and a second holding structure. The first holding structure is located between the micro light-emitting device and the substrate, and the second holding structure is located on an outer side of the first holding structure and directly contacts with the substrate and a side surface of the micro light-emitting device.

In an embodiment of the invention, the first holding structure of each of the plurality of holding structures are connected seamlessly to the second holding structure.

In an embodiment of the invention, a ratio of a contact area between the second holding structure and the side surface of the micro light-emitting device to a surface area of the side surface of the micro light-emitting device falls within a range from 0.05 to 0.5, and a ratio of a height of the second holding structure contacting the side surface of the micro light-emitting device to a height of the micro light-emitting device falls within a range from 0.1 to 0.8.

In an embodiment of the invention, the buffer layer directly contacts with the holding structure.

In an embodiment of the invention, the buffer layer directly contacts with the holding structure, the micro light-emitting device and the substrate, and the buffer layer has a plurality of air gaps therein.

In an embodiment of the invention, the buffer layer includes a first buffer layer and a second buffer layer, wherein the first buffer layer directly contacts with the micro light-emitting device, the second buffer layer directly contacts with the substrate, and an air gap exists between the first buffer layer and the second buffer layer.

In an embodiment of the invention, the buffer layer directly contacts with the substrate, and an air gap exists between the buffer layer and the micro light-emitting device.

In an embodiment of the invention, the buffer layer directly contacts with the micro light-emitting device, and an air gap exists between the buffer layer and the substrate.

In an embodiment of the invention, the buffer layer has a cross-sectional profile in an irregular shape.

In an embodiment of the invention, the buffer layer directly contacts with the substrate and the micro light-emitting device and is disposed in the middle of the micro light-emitting device, and a plurality of air gaps exist between the micro light-emitting device, the substrate, the buffer layer and the holding structure.

In an embodiment of the invention, the micro light-emitting device includes two micro light-emitting devices and the holding structure includes a plurality of holding structures. One of the plurality of holding structures is located between the micro light-emitting devices and the substrate.

In an embodiment of the invention, a material of the buffer layer is different from a material of the holding structure.

In an embodiment of the invention, a Young's modulus of the micro light-emitting device is respectively greater than a Young's modulus of the holding structure and a Young's modulus of the buffer layer, and the Young's modulus of the holding structure is greater than the Young's modulus of the buffer layer.

Based on the above, the structure with micro light-emitting device of the invention includes at least one holding structure and a buffer layer located between the substrate and the micro light-emitting device, wherein the holding structures is arranged at an edge of the micro light-emitting device, located between the substrate and the micro light-emitting device and directly contacts with the substrate, and the buffer layer is disposed between the micro light-emitting device, the holding structure and the substrate. As such, the substrate and the micro light-emitting device have an excellent holding, supporting and buffering strength in between.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 4A and FIG. 4B are schematic cross-sectional views of structures with micro light-emitting device according to a plurality of embodiments of the invention.

DESCRIPTION OF THE EMBODIMENTS

Figure 1A:
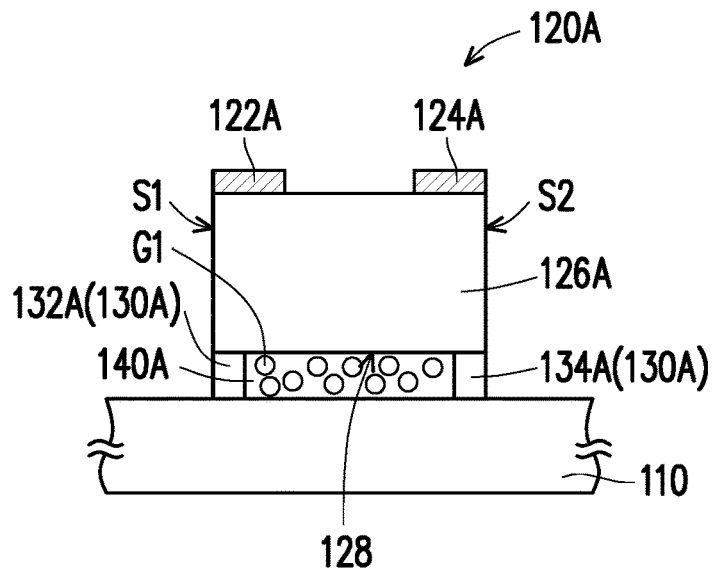
FIG. 1A is a schematic cross-sectional view of a structure with micro light-emitting device according to an embodiment of the invention.

Some other embodiments of the invention are provided as follows. It should be noted that the reference numerals and part of the contents of the previous embodiment are used in the following embodiments, in which identical reference numerals indicate identical or similar components, and repeated description of the same technical contents is omitted. Please refer to the description of the previous embodiment for the omitted contents, which will not be repeated hereinafter.

Figure 2A:
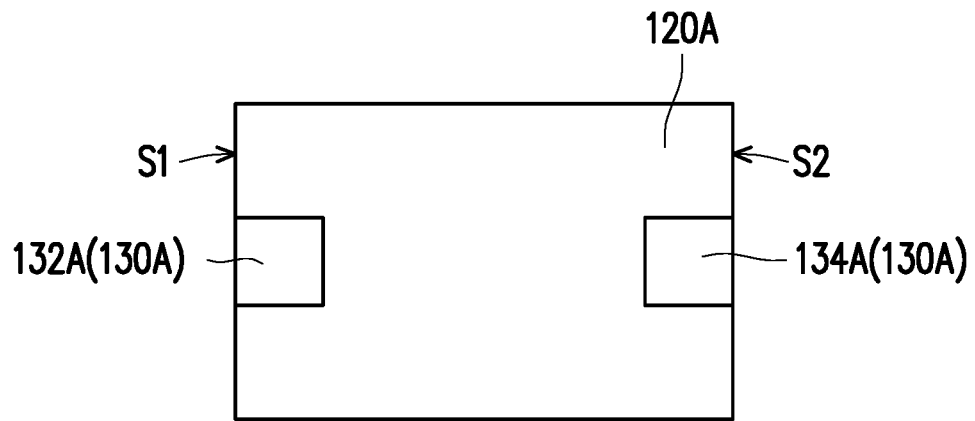
FIG. 2A is a schematic top view of a structure with micro light-emitting device of FIG. 1A.

FIG. 1A is a schematic cross-sectional view of a structure with micro light-emitting device according to an embodiment of the invention. FIG. 2A is a schematic top view of a structure with micro light-emitting device of FIG. 1A. It should be noted herein that FIG. 2A is an exemplary illustration of a plane formed by the micro light-emitting device 120A and the holding structure 130A of FIG. 1A contacting with each other. Referring to FIG. 1A and FIG. 2A, in this embodiment, a structure with micro light-emitting device 100A includes a substrate 110, at least one micro light-emitting device 120A (one micro light-emitting device 120A is illustrated in FIG. 1A as an example), at least one holding structure 130A (a plurality of holding structures 130A is illustrated in FIG. 1A as an example) and a buffer layer 140A. The micro light-emitting device 120A is disposed on the substrate 110. The plurality of holding structures 130A are dispersedly arranged at edges of the micro light-emitting device 120A, and are located between the substrate 110 and the micro light-emitting device 120A and directly contact with the substrate 110. The buffer layer 140A is disposed between the micro light-emitting device 120A, the plurality of holding structures 130A and the substrate 110. The substrate 110 is, for example, a temporary substrate such as a sapphire substrate, a glass substrate or a plastic substrate, which may not have a work circuit thereon but serve as a temporary holder supporting the micro light-emitting device 120A. However, the invention is not limited thereto.

In detail, as shown in FIG. 1A, in this embodiment, the micro light-emitting device 120A is located on one side of the substrate 110 and includes a first type electrode 122A, a second type electrode 124A and an epitaxial structure 126A. A largest width of the micro light-emitting device 120A is within a range from 1 μm to 150 μm, more preferably within a range from 1 μm to 50 μm, and a width of the epitaxial structure 126A is preferably within a range from 1 μm to 6 μm. The first type electrode 122A and the second type electrode 124A are disposed on two opposite edges S1 and S2 of the same side of the epitaxial structure 126A and are electrically insulated from each other. That is, the micro light-emitting device 120A in this embodiment is embodied as a horizontal type micro light-emitting device or a flip-chip micro light-emitting device. The first type electrode 122A and the second type electrode 124A are respectively aligned with the two opposite edges Si and S2 of the epitaxial structure 126A so that the current on the two edges S1 and S2 are more even, but the invention is not limited thereto. The epitaxial structure 126A is located between the first type electrode 122A and the second type electrode 124A and the substrate 110, wherein the first type electrode 122A is, for example, an n-type electrode electrically connected to an n-type epitaxial layer (not illustrated) of the epitaxial structure 126A, and the second type electrode 124A is, for example, a p-type electrode electrically connected to a p-type epitaxial layer (not illustrated) of the epitaxial structure 126A. In other embodiments, the first type electrode 122A may be a p-type electrode, and the second type electrode 124A may be an n-type electrode. The invention is not limited thereto. A light emitting surface 128 of the micro light-emitting device 120A is herein embodied as facing the substrate 110 but is not limited thereto.

Referring to both FIG. 1A and FIG. 2A, the plurality of holding structures 130A in this embodiment are embodied as two holding structures 132A and 134A, disposed separately on the two opposite edges S1 and S2 of the micro light-emitting device 120A and aligned with the edges S1 and S2 of the micro light-emitting device 120A. Specifically, in this embodiment, the holding structures 132A and 134A are both disposed on the same side of the micro light-emitting device 120A close to the substrate 110 and are located opposite to each other on the opposite edges S1 and S2 of the micro light-emitting device 120A. A distance from the holding structure 132A to a center of the micro light-emitting device 120A is equal to a distance from the holding structure 134A to the center of the micro light-emitting device 120A. In other words, the holding structures 132A and 134A are symmetrically arranged with respect to the center of the micro light-emitting device 120A. In other embodiments not illustrated herein, the holding structures may be symmetrically arranged with respect to the center of the micro light-emitting device in different ways, the holding structures may be close to but not aligned with the edges of the micro light-emitting device, or a slight offset of ±5% may exist between the location of the holding structures and the edges of the micro light-emitting device due to errors in the manufacturing processes. As long as the holding structures support the micro light-emitting device steadily for better picking the same in the following process, such structure belongs to the scope for which the invention seeks protection. In particular, a ratio of a contact area between the micro light-emitting device 120A and the plurality of holding structures 130A to an orthogonal projection area of the micro light-emitting device 120A on the substrate 110 falls within a range from 0.05 to 0.15. Herein, the contact area between the plurality of holding structures 130A and the micro light-emitting device 120A is a total of a contact area between a bottom surface of the micro light-emitting device 120A and the holding structure 132A and a contact area between a bottom surface of the micro light-emitting device 120A and the holding structure 134A. Preferably, if the ratio of area is greater than 0.05, the plurality of holding structures 130A are strong enough to support and hold the weight of the micro light-emitting device 120A; if the ratio is smaller than 0.15, the micro light-emitting device 120A is better picked in the following process and the process of transferring the micro light-emitting device 120A to the receiving substrate (not illustrated) has better smoothness and reliability. Top profiles of the holding structures 132A and 134A are embodied as in rectangle shapes. In other words, the contact area between the micro light-emitting device 120A and the holding structures 132A and 134A is a total of two rectangle areas. However, in other embodiments not illustrated herein, according to the practical design requirements, the top profile of each of the holding structures may be in shapes that allow the holding structures to hold the micro light-emitting device, such as polygonal, half-circular, half-elliptical or irregular shape and is not limited thereto. A material of the plurality of holding structures 130A is, for example, an insulating material having a Young's modulus smaller than 30 GPa that allows the micro light-emitting device 120A to be supported steadily and better picked in the following process and avoids affecting the electrical property of the micro light-emitting device 120A.

Still referring to FIG. 1A and FIG. 2A, in this embodiment, the buffer layer 140A is disposed between the substrate 110, the plurality of holding structures 130A and the epitaxial structure 126A of the micro light-emitting device 120A, and directly contacts with the substrate 110, the epitaxial structure 126A of the micro light-emitting device 120A and the plurality of holding structures 130A. Herein, the buffer layer 140A may absorb the stress generated when connecting the micro light-emitting device 120A to the substrate 110 and thereby enhances the yield of connection. In other words, the buffer layer 140A herein may provide an effect of buffering the stress between the micro light-emitting device 120A and the substrate 110. The material of the buffer layer 140A herein is different from that of the plurality of holding structures 130A and is an insulating material, including foaming materials or other polymers. The buffer layer 140A has a plurality of irregular air gaps G1 and may have a porosity equal to or greater than 50%, providing an effective buffer strength between the substrate 110 and the micro light-emitting device 120A.

It should be noted additionally that, the material of the buffer layer 140A is different from that of the plurality of holding structures 130A. Therefore, during the manufacturing process, the buffer layer 140A may be etched through the selection of etchant, the bonding strength between the micro light-emitting device 120A and the buffer layer 140A may be lowered, the supporting strength and temporary holding strength of the plurality of holding structures 130A to the micro light-emitting device 120A may be maintained, and the buffering strength of the buffer layer 140A when bonding the micro light-emitting device 120A may also be maintained. It should be particularly noted that, in this embodiment, the Young's modulus of the buffer layer 140A is smaller than that of the plurality of holding structures 130A, and the Young's modulus of the plurality of holding structures 130A is smaller than that of the micro light-emitting device 120A. Therefore, the plurality of holding structures 130A have a rigidity providing the strength for supporting the micro light-emitting device 120A and have a brittleness allowing the picking apparatus (not illustrated) to easily pick the micro light-emitting device 120A from the substrate 110, and the buffer layer 140A serves as a buffer when bonding the micro light-emitting device 120A since it has a smaller Young's modulus. As such, by the design of the plurality of holding structures 130A and the buffer layer 140A in this embodiment, the micro light-emitting device 120A is picked from the substrate 110 more easily. In addition, since the plurality of holding structures 130A are dispersedly arranged at edges of the micro light-emitting device 120A, if a residue of the holding structures 130A is left after the micro light-emitting device 120A is picked from the substrate 110, the residue of the holding structures 130A, due to the location thereof, does not affect the following eutectic bonding or the light emitting area and light emitting efficiency.

It should be noted herein that the reference numerals and part of the contents of the previous embodiment are used in the following embodiments, in which identical reference numerals indicate identical or similar components, and descriptions of the same technical contents are omitted. Please refer to the description of the previous embodiment for the omitted contents, which will not be repeated hereinafter.

Figure 1B:
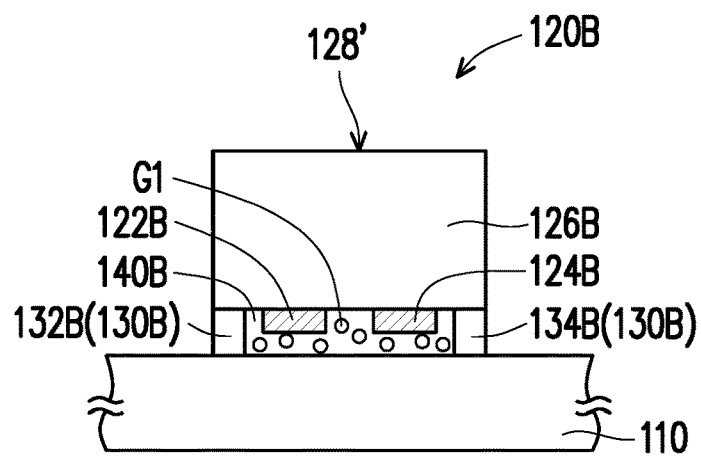
FIG. 1B and FIG. 1C are schematic cross-sectional views of structures with micro light-emitting device according to a plurality of embodiments of the invention.

FIG. 1B is a schematic cross-sectional view of a structure with micro light-emitting device according to another embodiment of the invention. Referring to both FIG. 1A and FIG. 1B, a structure with micro light-emitting device 100B in this embodiment is similar to the structure with micro light-emitting device 100A of FIG. 1A, wherein the differences are as follows. In a micro light-emitting device 120B in this embodiment, a first type electrode 122B and a second type electrode 124B are located between an epitaxial structure 126B and the substrate 110. A plurality of holding structures 130B in this embodiment are embodied as two holding structures 132B and 134B, located between the substrate 110 and the micro light-emitting device 120B. The plurality of holding structure 130B directly contact with the substrate 110. A buffer layer 140B is located between the substrate 110, the plurality of holding structures 130B and the epitaxial structure 126B and directly contacts the substrate 110, the plurality of holding structures 130B, the first type electrode 122B and the second type electrode 124B and the epitaxial structure 126B of the micro light-emitting device 120B. A light emitting surface 128' of the micro light-emitting device 120B is herein embodied as away from the substrate 110, in other words, the micro light-emitting device 120B is disposed on the substrate 110 with the light emitting surface 128' facing up, but is not limited thereto.

Figure 1C:
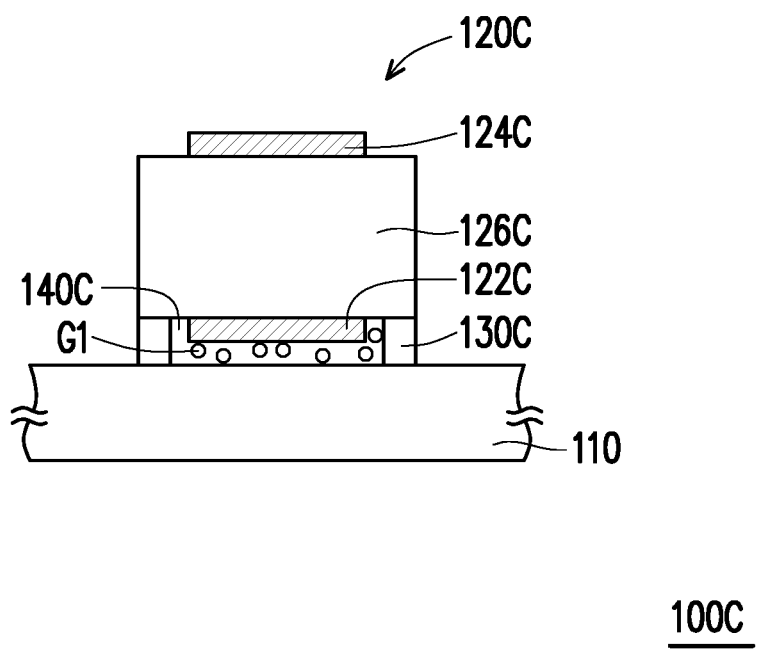

FIG. 1C is a schematic cross-sectional view of a structure with micro light-emitting device according to another embodiment of the invention. Referring to both FIG. 1A and FIG. 1C, a structure with micro light-emitting device 100C in this embodiment is similar to the structure with micro light-emitting device 100A of FIG. 1A, wherein the differences are as follows. In a micro light-emitting device 120C in this embodiment, a first type electrode 122C and a second type electrode 124C are disposed separately on two opposite sides of the epitaxial structure 126C, the first type electrode 122C is located between the epitaxial structure 126C and the substrate 110, and the buffer layer 140C directly contacts the substrate 110 and the first type electrode 122C of the micro light-emitting device 120C. Herein, the micro light-emitting device 120C of the present embodiment is embodied as a vertical type micro light-emitting device, and a light emitting surface of the micro light-emitting device 120C can be a facing up type or a facing down type according to the actual design, which is not limited herein.

Figure 2B:
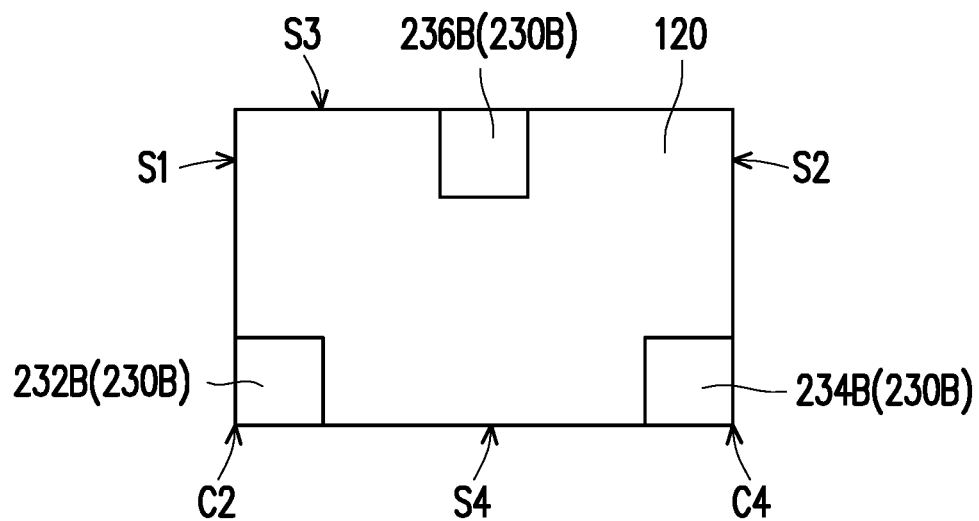
FIG. 2B to FIG. 2F are schematic top views of structures with micro light-emitting device according to a plurality of embodiments of the invention.

FIG. 2B is a schematic cross-sectional view of a structure with micro light-emitting device according to another embodiment of the invention. Referring to both FIG. 2A and FIG. 2B, a structure with micro light-emitting device 200B in this embodiment is similar to the structure with micro light-emitting device 100A of FIG. 2A, wherein the differences are as follows. A plurality of holding structures 230B are in a number of three, namely holding structures 232B, 234B and 236B, and the holding structures 232B, 234B and 236B are separately from each other. In detail, two holding structures 232B and 234B of the plurality of holding structures 230B are disposed on two corners C2 and C4 on the same edge S4 of the micro light-emitting device 120, and one holding structure 236B of the plurality of holding structures 230B is disposed on another edge S3 opposite to the edge S4. Specifically, the holding structure 232B is disposed on the corner C2 formed by the edge Si and the edge S4 of the micro light-emitting device 120, the holding structure 234B is disposed on the corner C4 formed by the edge S2 and the edge S4 of the micro light-emitting device 120, and the holding structure 236B is disposed on the center line of the edge S3 of the micro light-emitting device 120. A line connecting the holding structures 232B, 234B and 236B forms an isosceles triangle, but is not limited thereto. In other embodiments not illustrated herein, a line connecting the holding structures may form a triangle of other types, such as an acute triangle. It should be particularly noted that, a slight offset of ±5% may exist between the location of the holding structures 232B, 234B and 236B and the edges of the micro light-emitting device 120 due to errors in the manufacturing processes. As long as the holding structures support the micro light-emitting device steadily, such structure belongs to the scope for which the invention seeks protection.

Figure 2C:
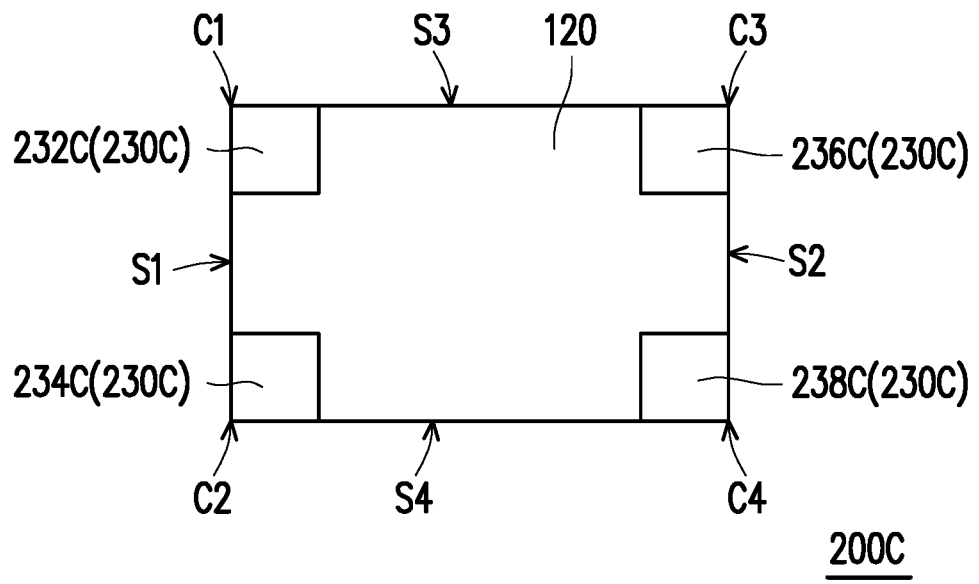

FIG. 2C is a schematic cross-sectional view of a structure with micro light-emitting device according to another embodiment of the invention. Referring to both FIG. 2A and FIG. 2C, a structure with micro light-emitting device 200C in this embodiment is similar to the structure with micro light-emitting device 100A of FIG. 2A, wherein the differences are as follows. A plurality of holding structures 230C are disposed on the four corners C1, C2, C3 and C4 of the micro light-emitting device 120. The plurality of holding structures 230C are aligned with the four edges S1, S2, S3 and S4 of the micro light-emitting device 120, which may allow the micro light-emitting device 120 to be disposed more steadily on the substrate 110, but are not limited thereto. Specifically, in this embodiment, the plurality of holding structures 230C are embodied as four holding structures 232C, 234C, 236C and 238C, and the holding structures 232C, 234C, 236C and 238C are separate from each other. The holding structure 232C is disposed on the corner C2 formed by the edge S1 and the edge S3 of the micro light-emitting device 120, the holding structure 234C is disposed on the corner C2 formed by the edge S1 and the edge S4 of the micro light-emitting device 120, the holding structure 236C is disposed on the corner C3 formed by the edge S3 and the edge S2 of the micro light-emitting device 120, and the holding structure 238C is disposed on the corner C4 formed by the edge S2 and the edge S4 of the micro light-emitting device 120. Herein, a line connecting the holding structure 232C and the holding structure 238C meets a line connecting the holding structure 234C and the holding structure 236C at the center of the micro light-emitting device 120. In other words, the holding structures 232C, 234C, 236C and 238C are arranged symmetrically with respect to and disposed equidistant from the center of the micro light-emitting device 120. It should be particularly noted that, a slight offset of ±5% may exist between the location of the holding structures 232C, 234C, 236C and 238C and the edges of the micro light-emitting device 120 due to errors in the manufacturing processes. As long as the holding structures support the micro light-emitting device steadily, such structure belongs to the scope for which the invention seeks protection.

Figure 2D:
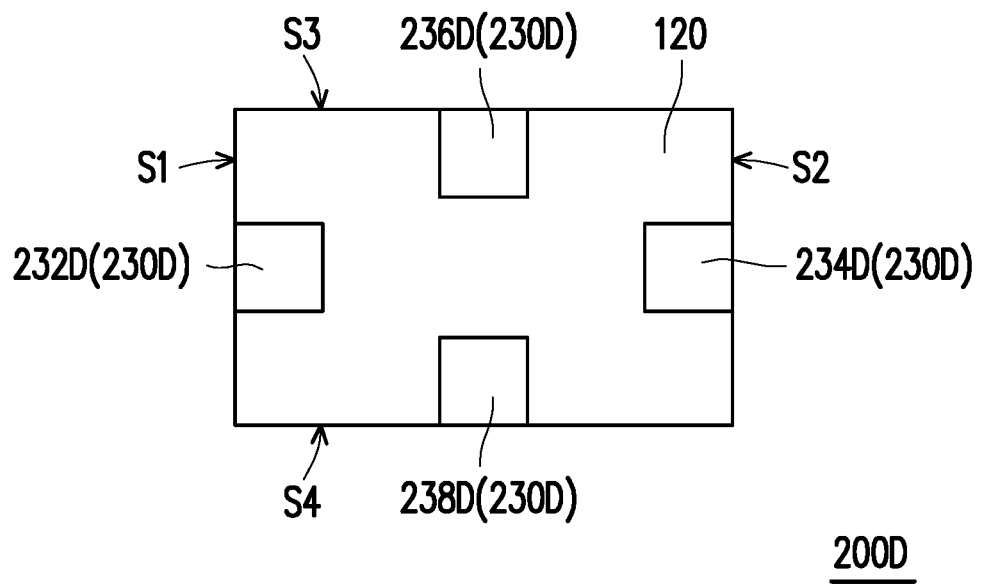

FIG. 2D is a schematic cross-sectional view of a structure with micro light-emitting device according to another embodiment of the invention. Referring to both FIG. 2A and FIG. 2D, a structure with micro light-emitting device 200D in this embodiment is similar to the structure with micro light-emitting device 100A of FIG. 2A, wherein the differences are as follows. A plurality of holding structures 230D in this embodiment are respectively disposed on and are respectively aligned with the four edges S1, S2, S3 and S4 of the micro light-emitting device 120. Specifically, in this embodiment, the plurality of holding structures 230D are embodied as four holding structures 232D, 234D, 236D and 238D, and the holding structures 232D, 234D, 236D and 238D are separate from each other. The holding structure 232D is disposed on the center line of the edge S1, the holding structure 234D is disposed on the center line of the edge S2 opposite to the holding structure 232D, and a line connecting the holding structure 232D and holding structure 234D passes the center of the micro light-emitting device 120. The holding structure 236D is disposed on the center line of the edge S3, the holding structure 238D is disposed on the center line of the edge S4 opposite to the holding structure 236D, and a line connecting the holding structure 236D and holding structure 238D passes the center of the micro light-emitting device 120. Herein, a line connecting the holding structure 232D and the holding structure 234D meets a line connecting the holding structure 236D and the holding structure 238D at the center of the micro light-emitting device 120. In other words, the holding structures 232D, 234D, 236D and 238D are symmetrically arranged with respect to the center of the micro light-emitting device 120. It should be particularly noted that, a slight offset of ±5% may exist between the location of the holding structures 232D, 234D, 236D and 238D and the edges of the micro light-emitting device 120 due to errors in the manufacturing processes. As long as the holding structures support the micro light-emitting device steadily, such structure belongs to the scope for which the invention seeks protection.

Figure 2E:
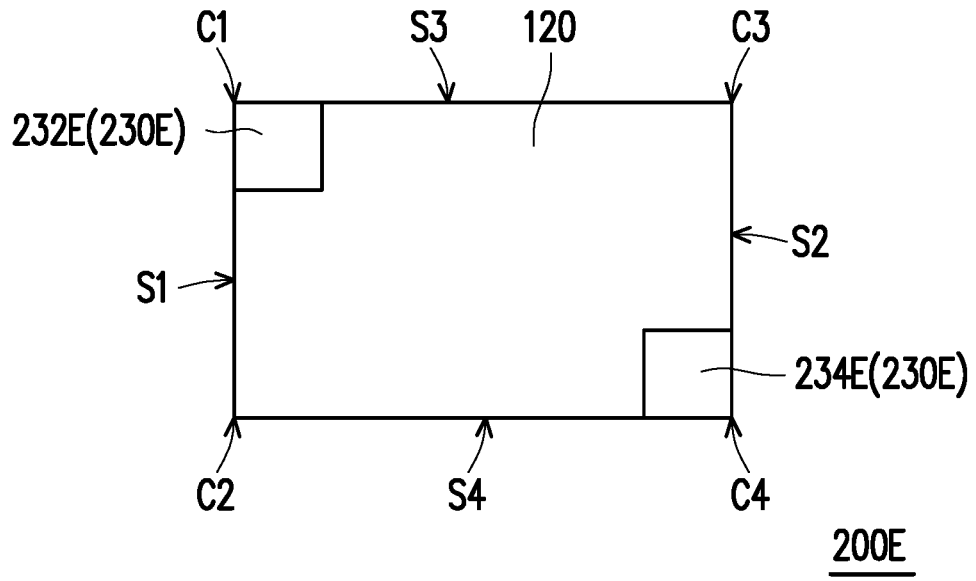

FIG. 2E is a schematic cross-sectional view of a structure with micro light-emitting device according to another embodiment of the invention. Referring to both FIG. 2A and FIG. 2E, a structure with micro light-emitting device 200E in this embodiment is similar to the structure with micro light-emitting device 100A of FIG. 2A, wherein the differences are as follows. A plurality of holding structures 230E in this embodiment are embodied as two holding structures 232E and 234E, disposed respectively on the two corners C1 and C4 of the micro light-emitting device 120 on a diagonal line and aligned with the four edges S1, S2, S3 and S4 of the micro light-emitting device 120A. Specifically, the holding structures 232E and 234E are separate from each other. The holding structure 232E is disposed on the corner C1 formed by the edge S1 and the edge S3 of the micro light-emitting device 120, the holding structure 234E is disposed on the corner C4 formed by the edge S2 and the edge S4 of the micro light-emitting device 120. A line connecting the center of the holding structures 232E and 234E and the center of the micro light-emitting device 120 may be formed as a straight line, and a distance from the holding structure 232E to the center of the micro light-emitting device 120 equals a distance from the holding structure 234E to the center of the micro light-emitting device 120. In other words, the holding structures 232E and 234E are symmetrically arranged with respect to the center of the micro light-emitting device 120. However, in other embodiments, the holding structures 232E and 234E may be disposed respectively on the two corners C2 and C3 of the micro light-emitting device 120 on a diagonal line. It should be particularly noted that, a slight offset of ±5% may exist between the location of the holding structures 232E and 234E and the edges of the micro light-emitting device 120 due to errors in the manufacturing processes. As long as the holding structures support the micro light-emitting device steadily, such structure belongs to the scope for which the invention seeks protection.

Figure 2F:
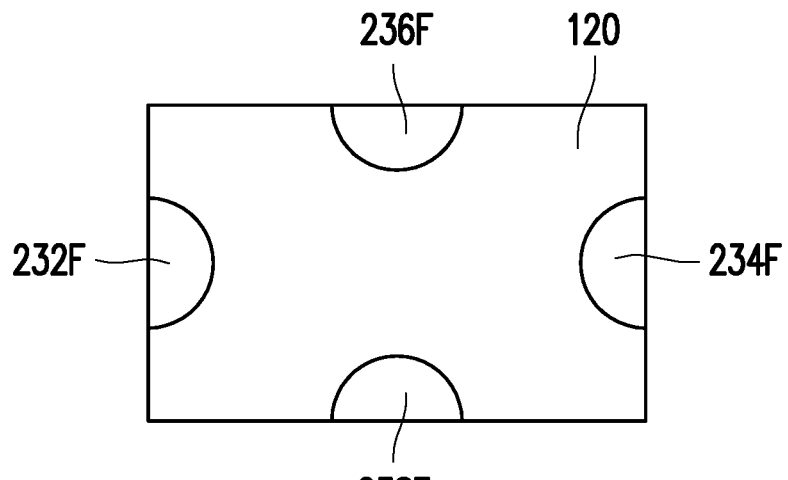

FIG. 2F is a schematic cross-sectional view of a structure with micro light-emitting device according to another embodiment of the invention. Referring to both FIG. 2D and FIG. 2F, a structure with micro light-emitting device 200F in this embodiment is similar to the structure with micro light-emitting device 200D of FIG. 2D, wherein the differences are as follows. Top profiles of the holding structures 232F, 234F, 236F and 238F are in curved shapes, for example, in half-circular sharps. In other words, the contact area between the holding structures 232F, 234F, 236F and 238F and the micro light-emitting device 120 is a total of four half-circular areas. However, in other embodiments not illustrated herein, according to the practical design requirements or the change of weight of the micro light-emitting device, the holding structures may have top profiles in different shapes or may be in a different number. It should be particularly noted that, a slight offset of ±5% may exist between the location of the holding structures 232F, 234F, 236F and 238F and the edges of the micro light-emitting device 120 due to errors in the manufacturing processes. As long as the holding structures support the micro light-emitting device steadily, such structure belongs to the scope for which the invention seeks protection.

Figure 3A:
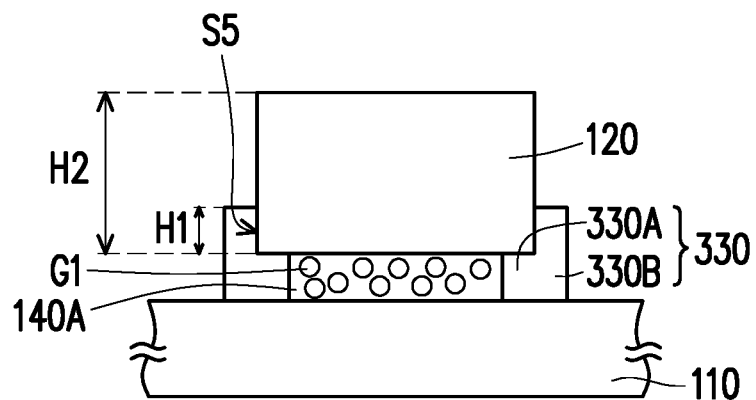
FIG. 3A is a schematic cross-sectional view of a structure with micro light-emitting device according to another embodiment of the invention.
Figure 3B:
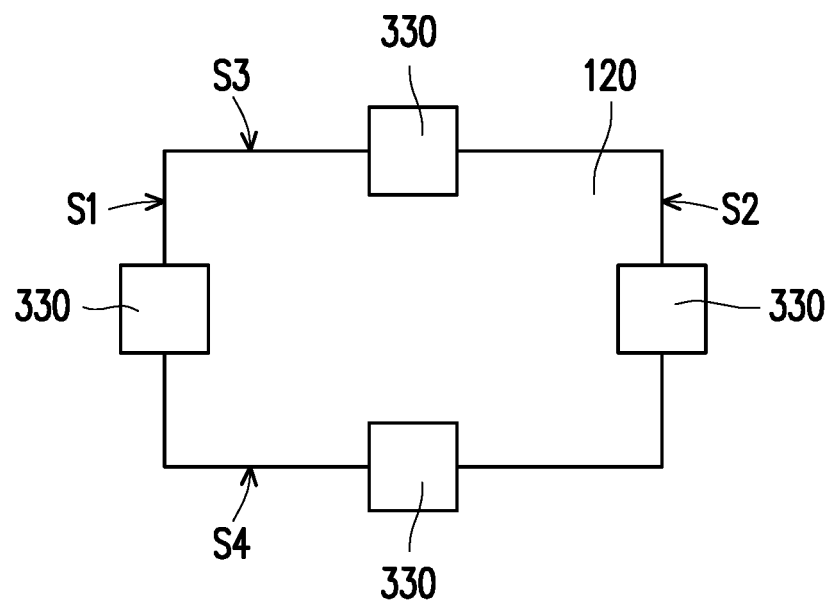
FIG. 3B is a schematic top view of a structure with micro light-emitting device of FIG. 3A.

FIG. 3A is a schematic cross-sectional view of a structure with micro light-emitting device according to another embodiment of the invention. FIG. 3B is a schematic top view of a structure with micro light-emitting device of FIG. 3A. Referring to both FIG. 1A and FIG. 3A, a structure with micro light-emitting device 300 in this embodiment is similar to the structure with micro light-emitting device 100A of FIG. 1A, wherein the differences are as follows. In this embodiment, a plurality of holding structures 330 includes a first holding structure 330A and a second holding structure 330B. In this embodiment, the plurality of holding structures 330 are herein embodied as in a number of four, and each of the plurality of holding structures 330 includes the first holding structure 330A and the second holding structure 330B, but the number of the plurality of holding structures 330 are not limited thereto. The first holding structure 330A is located between the micro light-emitting device 120 and the substrate 110, and the second holding structure 330B is located on an outer side of the first holding structure 330A and directly contacts with the substrate 110 and a side surface S5 of the micro light-emitting device 120, so the first holding structure 330A and the second holding structure 330B provide more steady strength for holding and supporting. Herein, the first holding structure 330A and the second holding structure 330B of the plurality of holding structures 330 are connected seamlessly. In other words, the first holding structure 330A and the second holding structure 330B are embodied as formed integrally and by the same material, but are not limited thereto.

Specifically, referring to both FIG. 3A and FIG. 3B, in this embodiment, an orthogonal projection of the first holding structure 330A on the substrate 110 completely overlaps that of the micro light-emitting device 120 on the substrate 110, as an orthogonal projection of the second holding structure 330B on the substrate 110 does not overlap that of the micro light-emitting device 120 on the substrate 110. The second holding structure 330B of each of the plurality of holding structures 330 covers a part of the side surface S5 of the micro light-emitting device 120 and protrudes from the four edges S1, S2, S3 and S4 of the micro light-emitting device 120. Herein, a ratio of a height H1 of the second holding structure 330B contacting the side surface S5 of the micro light-emitting device 120 to a height H2 of the micro light-emitting device 120 falls within a range from 0.1 to 1. Preferably, the ratio is between 0.1 and 0.8. Only if the ratio of height is greater than 0.1 the plurality of holding structures 130A have enough strength for supporting and holding the weight of the micro light-emitting device 120; if the ratio of height is smaller than 0.8, the micro light-emitting device 120 is better picked in the following process. A ratio of a contact area between the second holding structure 330B and the side surface S5 of the micro light-emitting device 120 to a surface area of the side surface S5 of the micro light-emitting device 120 falls within a range from 0.05 to 0.5. Only if the ratio of area is greater than 0.05 the plurality of holding structures 130A have enough strength for supporting and holding the weight of the micro light-emitting device 120; if the ratio of area is smaller than 0.5, the micro light-emitting device 120 is better picked in the following process. Herein, the plurality of holding structures 330 may have cross-sections in an L-shape, and a cross-sectional height of the second holding structure 330B is greater than that of the first holding structure 330A, but the invention is not limited thereto.

Figure 3C:
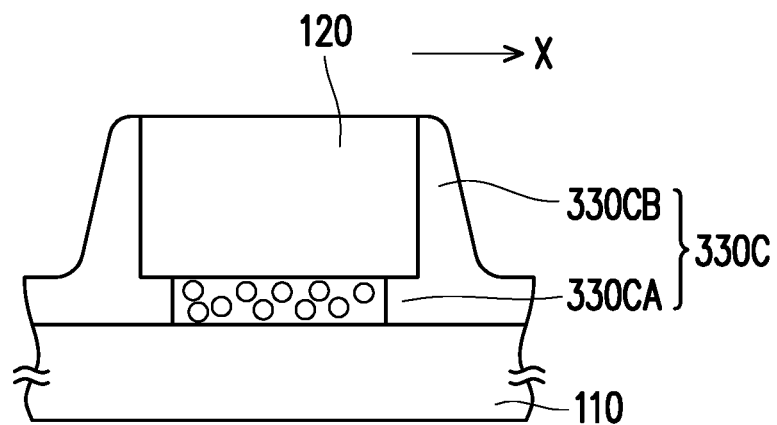
FIG. 3C to FIG. 3F are schematic cross-sectional views of structures with micro light-emitting device according to a plurality of embodiments of the invention.

FIG. 3C is a schematic cross-sectional view of a structure with micro light-emitting device according to another embodiment of the invention. Referring to both FIG. 3A and FIG. 3C, a structure with micro light-emitting device 300C in this embodiment is similar to the structure with micro light-emitting device 300A of FIG. 3A, wherein the differences are as follows. Each of the plurality of holding structures 330C includes the first holding structure 330CA and the second holding structure 330CB. The first holding structure 330CA is located between the micro light-emitting device 120 and the substrate 110. The second holding structure 330CB is located on an outer side of the first holding structure 330CA, wherein a width of the second holding structure 330CB is gradually broadened toward the substrate 110 along a direction X, thereby providing more steady strength for holding and supporting.

Figure 3D:
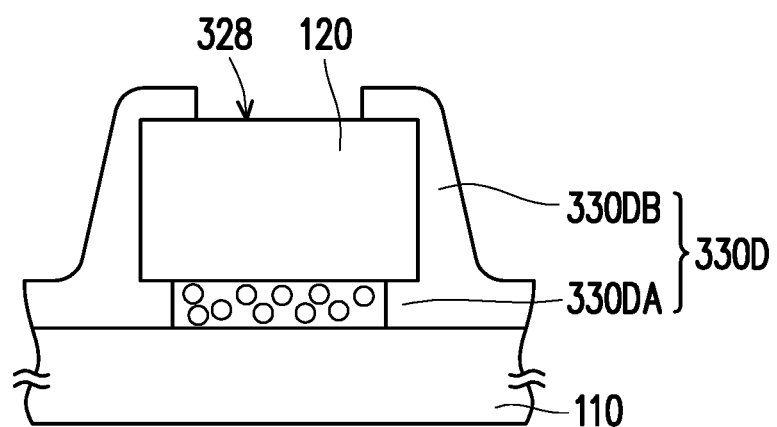

FIG. 3D is a schematic cross-sectional view of a structure with micro light-emitting device according to another embodiment of the invention. Referring to both FIG. 3C and FIG. 3D, a structure with micro light-emitting device 300D in this embodiment is similar to the structure with micro light-emitting device 300C of FIG. 3C, wherein the differences are as follows. Each of the plurality of holding structures 330D includes the first holding structure 330DA and the second holding structure 330DB. The second holding structure 330DB is located on an outer side of the first holding structure 330DA and extends onto a surface 328 of the micro light-emitting device 120. Herein, the second holding structure 330DB is partially disposed on the surface 328 of the light-emitting device 120, thereby providing more steady strength for holding and supporting. In other embodiments not illustrated herein, the holding structure 330D may also be disposed on the surface 328 of the light-emitting device 120 continuously, which is not limited herein.

Figure 3E:
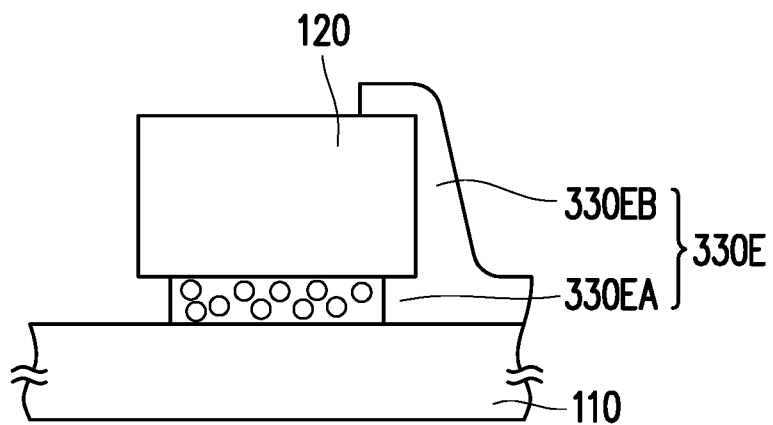

FIG. 3E is a schematic cross-sectional view of a structure with micro light-emitting device according to another embodiment of the invention. Referring to both FIG. 3D and FIG. 3E, a structure with micro light-emitting device 300E in this embodiment is similar to the structure with micro light-emitting device 300D of FIG. 3D, wherein the differences are as follows. Each of the plurality of holding structures 330E includes the first holding structure 330EA and the second holding structure 330EB. The holding structure 300E of the present embodiment is only disposed on one side, that is, the holding structure 330E is disposed on only one edge of the light-emitting device 120, thereby providing more steady strength for holding and supporting.

Figure 3F:
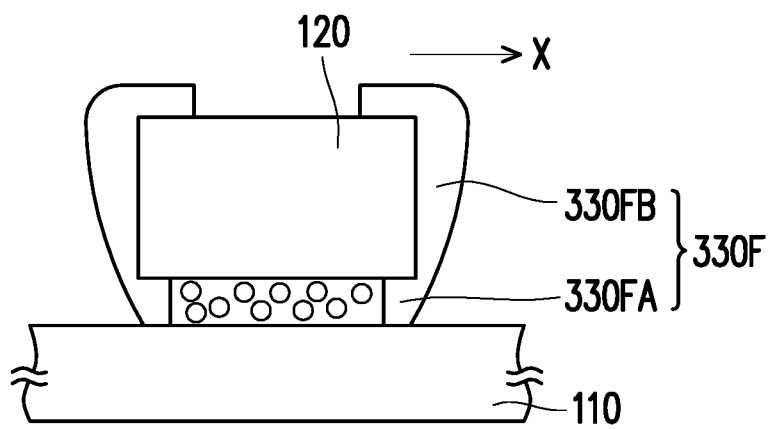

FIG. 3F is a schematic cross-sectional view of a structure with micro light-emitting device according to another embodiment of the invention. Referring to both FIG. 3D and FIG. 3F, a structure with micro light-emitting device 300F in this embodiment is similar to the structure with micro light-emitting device 300D of FIG. 3D, wherein the differences are as follows. Each of the plurality of holding structures 330F includes the first holding structure 330FA and the second holding structure 330FB. A width of the second holding structure 330FB gradually decreases toward the substrate 110 along a direction X, thereby providing more steady strength for holding and supporting.

FIG. 4A is a schematic cross-sectional view of a structure with micro light-emitting device according to another embodiment of the invention. Referring to both FIG. 1A and FIG. 4A, a structure with micro light-emitting device 400A in this embodiment is similar to the structure with micro light-emitting device 100A of FIG. 1A, wherein the differences are as follows. In this embodiment, the micro light-emitting device 120 includes two micro light-emitting devices 120F1 and 120F2, and one holding structure 432A of the plurality of holding structures 430A is located between the micro light-emitting device 120F1 and the substrate 110 and between the micro light-emitting device 120F2 and the substrate 110.

Specifically, two holding structures 432A and 434A exist between the micro light-emitting device 120F1 and the substrate 110 and are separate from each other, two holding structures 432A and 436A exist between the micro light-emitting device 120F2 and the substrate 110 and are separate from each other, and any two adjacent micro light-emitting devices 120F1 and 120F2 shares the common holding structure 432A in between. In other words, the holding structure 432A extends in between any two adjacent micro light-emitting devices 120F1 and 120F2, and an orthogonal projection of the holding structure 432A on the substrate 110 partially overlaps an orthogonal projection of any two adjacent micro light-emitting devices 120F1 and 120F2 on the substrate 110.

Figure 4B:
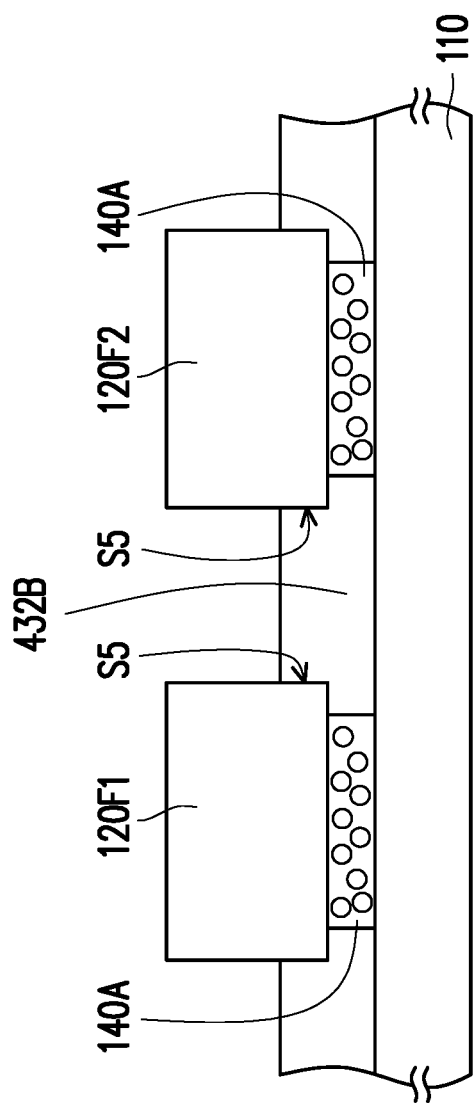

FIG. 4B is a schematic cross-sectional view of a structure with micro light-emitting device according to another embodiment of the invention. Referring to both FIG. 4A and FIG. 4B, a structure with micro light-emitting device 400B in this embodiment is similar to the structure with micro light-emitting device 400A of FIG. 4A, wherein the differences are as follows. In this embodiment, a holding structure 432B covers a part of a side surface S5 of any two adjacent micro light-emitting devices 120F1 and 120F2 and extends horizontally in between any two adjacent micro light-emitting devices 120F1 and 120F2.

Figure 5A:
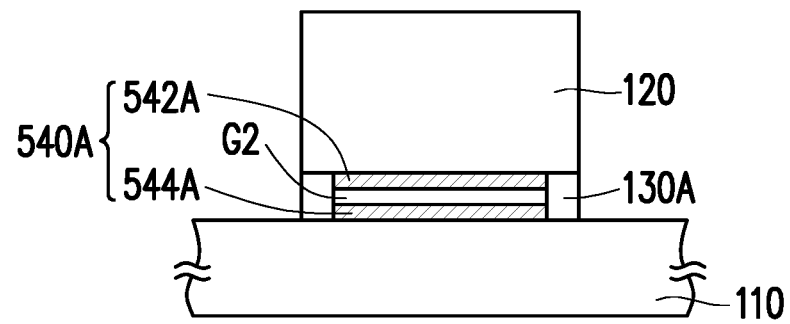
FIG. 5A to FIG. 5E are schematic cross-sectional views of structures with micro light-emitting device according to a plurality of embodiments of the invention.

FIG. 5A is a schematic cross-sectional view of a structure with micro light-emitting device according to another embodiment of the invention. Referring to both FIG. 1A and FIG. 5A, a structure with micro light-emitting device 500A in this embodiment is similar to the structure with micro light-emitting device 100A of FIG. 1A, wherein the differences are as follows. In this embodiment, a buffer layer 540A includes a first buffer layer 542A and a second buffer layer 544A, wherein the first buffer layer 542A directly contacts with the micro light-emitting device 120, the second buffer layer 544A directly contacts with the substrate 110, and an air gap G2 exists between the first buffer layer 542A and the second buffer layer 544A. Cross-sectional profiles of the first buffer layer 542A and the second buffer layer 544A are herein embodied as in rectangle shapes, but in other embodiments, the first buffer layer 542A and the second buffer layer 544A may be in irregular shapes or other shapes. The material of the buffer layer 540A herein is an insulating material, such as a foaming material or other polymer. The buffer layer 540A formed by such kind of material has an excellent elastic limit and effectively buffers in between the substrate 110 and the micro light-emitting device 120. It should be particularly noted that, the buffer layer 540A herein directly contacts the holding structure 130A and thus provides a strength for buffering and holding the same, so the holding structure are avoided from damages in the manufacturing process caused by movements and so on.

Figure 5B:
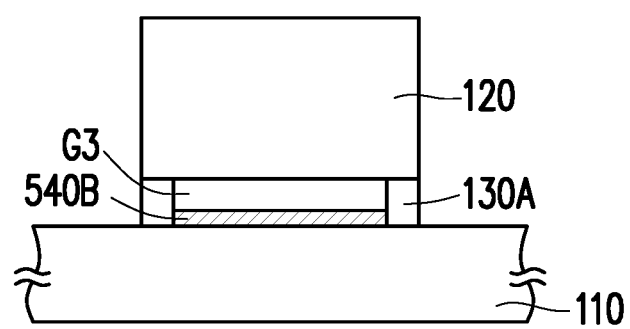

FIG. 5B is a schematic cross-sectional view of a structure with micro light-emitting device according to another embodiment of the invention. Referring to both FIG. 5A and FIG. 5B, a structure with micro light-emitting device 500B in this embodiment is similar to the structure with micro light-emitting device 500A of FIG. 5A, wherein the differences are as follows. In this embodiment, a buffer layer 540B directly contacts with the substrate 110 and the holding structure 130A, and an air gap G3 is located between the buffer layer 540B and the micro light-emitting device 120 and provides an effective buffer strength between the holding structure 130A, the substrate 110 and the micro light-emitting device 120.

Figure 5C:
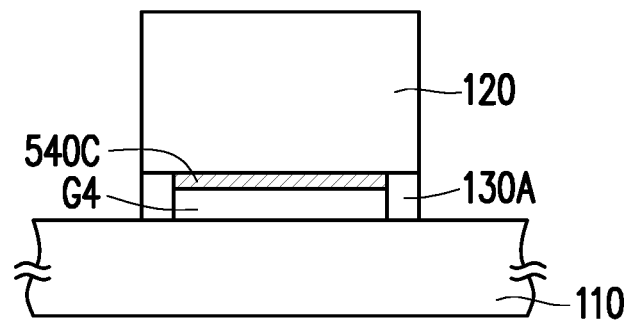

FIG. 5C is a schematic cross-sectional view of a structure with micro light-emitting device according to another embodiment of the invention. Referring to both FIG. 5A and FIG. 5C, a structure with micro light-emitting device 500C in this embodiment is similar to the structure with micro light-emitting device 500A of FIG. 5A, wherein the differences are as follows. A buffer layer 540C directly contacts with the micro light-emitting device 120, and an air gap G4 exists between the buffer layer 540C and the substrate 110.

Figure 5D:
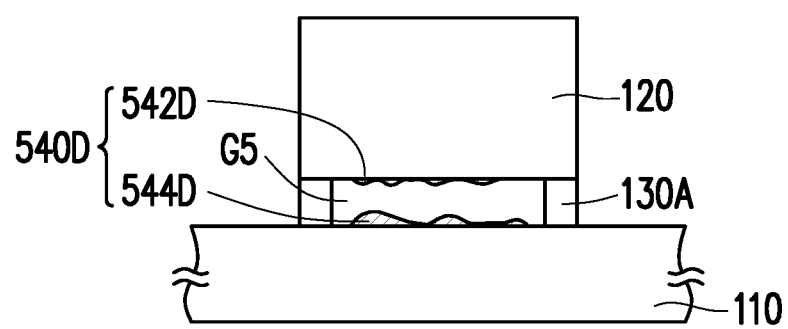

FIG. 5D is a schematic cross-sectional view of a structure with micro light-emitting device according to another embodiment of the invention. Referring to both FIG. 5A and FIG. 5D, a structure with micro light-emitting device 500D in this embodiment is similar to the structure with micro light-emitting device 500A of FIG. 5A, wherein the differences are as follows. In this embodiment, a first buffer layer 542D and a second buffer layer 544D of a buffer layer 540D have cross-sectional profiles embodied as in rectangle shapes, and the buffer layer 540D is embodied as an irregular nano-scale structure (such as within a range from 1 nm to 100 nm), which more effectively buffers and disperses the stress generated from bonding. In other words, the air gap G5 between the first buffer layer 542D and the second buffer layer 544D is also in an irregular shape, corresponding to the first buffer layer 542D and the second buffer layer 544D.

Figure 5E:
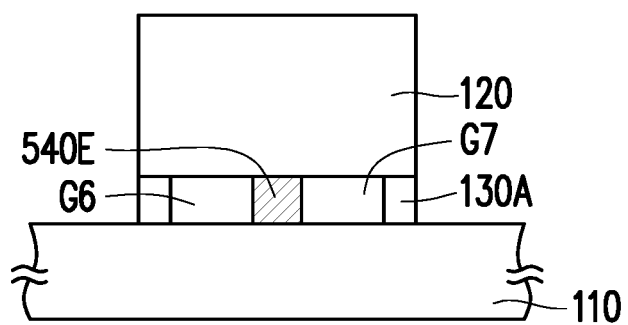

FIG. 5E is a schematic cross-sectional view of a structure with micro light-emitting device according to another embodiment of the invention. Referring to both FIG. 5A and FIG. 5E, a structure with micro light-emitting device 500B in this embodiment is similar to the structure with micro light-emitting device 500A of FIG. 5A, wherein the differences are as follows. In this embodiment, a buffer layer 540E directly contacts with the substrate 110 and the micro light-emitting device 120 and is disposed in the middle of the micro light-emitting device 120. A plurality of air gaps G6 and G7 exist between the micro light-emitting device 120, the substrate 110, the buffer layer 540E and the holding structure 130A for the buffer layer 540E to have functions of both buffering and supporting. More specifically, the buffer layer 540E directly contacts with the substrate 110 and the micro light-emitting device 120 but does not contact with the holding structure 130A, so that the buffer layer 540E buffers, supports and holds at the same time in the middle of the micro light-emitting device 120. It should be particularly noted that, in this embodiment, the buffer layer 540E is disposed in the center of the micro light-emitting device 120 for buffering and supporting a middle part of the micro light-emitting device 120, which is a more fragile part during bonding. However, in an embodiment not illustrated herein, the buffer layer 540E may slightly deviate from the center. As long as a plurality of air gaps exist between the micro light-emitting device, the substrate, the buffer layer and the holding structure for the buffer layer 540E to buffer and support at the same time, such structure belongs to the scope for which the invention seeks protection.

In addition, in other embodiments not illustrated herein, the micro light-emitting device 120A, 120B, 123C, the holding structure 230B, 230C, 230D, 230E, 230F, 330, 330C, 330D, 330E, 330F, 430A, 432B, and the buffer layer 540A, 540B, 540C, 540D and 540E of the aforementioned embodiments may also be used, so that the micro light-emitting device has different configuration of contact with the holding structure or with the buffer layer or temporarily holds and supports the micro light-emitting device with a different number of holding structure. As long as the micro light-emitting device maintains in a distance from the substrate by the holding structure for the micro light-emitting device to be picked from the substrate more easily in the following process, such structure belongs to the scope for which the invention seeks protection.

In sum of the above, since the structure with micro light-emitting device of the invention includes a plurality of holding structures and a buffer layer located between the substrate and the micro light-emitting device, wherein the plurality of holding structures are located between the substrate and the micro light-emitting device and directly contact with the substrate, and the buffer layer is disposed between the micro light-emitting device and the substrate, the substrate and the micro light-emitting device thereby have an excellent holding, supporting and buffering strength in between. In addition, the plurality of holding structures are dispersedly arranged at edges of the micro light-emitting device. As such, not only the micro light-emitting device are picked from the substrate without difficulties, but also the following eutectic bonding between the micro light emitting device and the receiving substrate, and the light emitting area and light emitting efficiency of the micro light emitting device are not affected.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A structure with micro light-emitting device, comprising:
   a substrate;
   at least one micro light-emitting device disposed on the substrate;
   at least one holding structure dispersedly arranged at an edge of the at least one micro light-emitting device, located between the substrate and the at least one micro light-emitting device and directly contacting with the substrate; and
   a buffer layer disposed between the at least one micro light-emitting device, the at least one holding structure and the substrate,
   wherein a material of the buffer layer is different from that of the at least one holding structure, and a Young's modulus of the at least one holding structure is greater than a Young's modulus of the buffer layer.

2. The structure with micro light-emitting device as recited in claim 1, wherein a ratio of a contact area between the at least one micro light-emitting device and the at least one holding structure to an orthogonal projection area of the at least one micro light-emitting device on the substrate falls within a range from 0.05 to 0.15.

3. The structure with micro light-emitting device as recited in claim 1, wherein the at least one holding structure is a plurality of holding structures, and the plurality of holding structures are arranged symmetrically with respect to a center of the at least one micro light-emitting device.

4. The structure with micro light-emitting device as recited in claim 1, wherein the at least one holding structure is aligned with the edge of the at least one micro light-emitting device.

5. The structure with micro light-emitting device as recited in claim 1, wherein the at least one holding structure comprises a first holding structure and a second holding structure, the first holding structure is located between the at least one micro light-emitting device and the substrate, and the second holding structure is located on an outer side of the first holding structure and directly contacts with the substrate and a side surface of the at least one micro light-emitting device.

6. The structure with micro light-emitting device as recited in claim 5, wherein the first holding structure of the at least one holding structure is connected seamlessly to the second holding structure.

7. The structure with micro light-emitting device as recited in claim 5, wherein a ratio of a contact area between the second holding structure and the side surface of the at least one micro light-emitting device to a surface area of the side surface of the at least one micro light-emitting device falls within a range from 0.05 to 0.5, and a ratio of a height of the second holding structure contacting the side surface of the at least one micro light-emitting device to a height of the at least one micro light-emitting device falls within a range from 0.1 to 1.

8. The structure with micro light-emitting device as recited in claim 1, wherein the buffer layer directly contacts with the at least one holding structure.

9. The structure with micro light-emitting device as recited in claim 8, wherein the buffer layer directly contacts with the at least one holding structure, the at least one micro light-emitting device and the substrate, and the buffer layer has a plurality of air gaps therein.

10. The structure with micro light-emitting device as recited in claim 8, wherein a buffer layer comprises a first buffer layer and a second buffer layer, the first buffer layer directly contacts with the at least one micro light-emitting device, the second buffer layer directly contacts with the substrate, and an air gap exists between the first buffer layer and the second buffer layer.

11. The structure with micro light-emitting device as recited in claim 8, wherein the buffer layer directly contacts with the substrate, and an air gap exists between the buffer layer and the at least one micro light-emitting device.

12. The structure with micro light-emitting device as recited in claim 8, wherein the buffer layer directly contacts with the at least one micro light-emitting device, and an air gap exists between the buffer layer and the substrate.

13. The structure with micro light-emitting device as recited in claim 1, wherein the buffer layer directly contacts with the substrate and the at least one micro light-emitting device and is disposed in the middle of the at least one micro light-emitting device, and a plurality of air gaps exist between the at least one micro light-emitting device, the substrate, the buffer layer and the at least one holding structure.

14. The structure with micro light-emitting device as recited in claim 1, wherein the buffer layer has a cross-sectional profile in an irregular shape.

15. The structure with micro light-emitting device as recited in claim 1, wherein the at least one micro light-emitting device comprises two micro light-emitting devices and the at least one holding structure comprises a plurality of holding structures, and one of the plurality of holding structures is located between the two micro light-emitting devices and the substrate.

16. The structure with micro light-emitting device as recited in claim 1, wherein a Young's modulus of the at least one micro light-emitting device is respectively greater than the Young's modulus of the at least one holding structure and the Young's modulus of the buffer layer.

* * * * *